United States Patent
He et al.

(10) Patent No.: US 9,438,252 B1
(45) Date of Patent: Sep. 6, 2016

(54) INTEGRATED CIRCUITS HAVING LOW POWER, LOW INTERFERENCE AND PROGRAMMABLE DELAY GENERATORS THEREIN AND METHODS OF OPERATING SAME

(71) Applicant: Integrated Device Technology, Inc., San Jose, CA (US)

(72) Inventors: Chengming He, Chandler, AZ (US); Ruben Eribes, Chandler, AZ (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/887,663

(22) Filed: Oct. 20, 2015

(51) Int. Cl.
*H03L 7/08* (2006.01)
*H03L 7/099* (2006.01)
*H03K 3/03* (2006.01)
*H03L 7/091* (2006.01)
*H03L 7/18* (2006.01)

(52) U.S. Cl.
CPC .......... *H03L 7/0805* (2013.01); *H03L 7/091* (2013.01); *H03L 7/0991* (2013.01); *H03L 7/0995* (2013.01); *H03L 7/18* (2013.01)

(58) Field of Classification Search
CPC . H03L 7/0805; H03L 7/0991; H03L 7/0995; H03L 7/18; H03L 7/085; H03K 3/0315
USPC ................................................. 331/1 A, 57
See application file for complete search history.

(56) References Cited

U.S. PATENT DOCUMENTS

| | | | |
|---|---|---|---|
| 5,428,309 A * | 6/1995 | Yamauchi | H03L 7/0995 327/156 |
| 6,784,755 B2 * | 8/2004 | Lin | H03L 7/0995 331/17 |
| 6,794,912 B2 * | 9/2004 | Hirata | H03K 5/1504 327/158 |
| 6,944,070 B1 | 9/2005 | Proebsting et al. | |
| 7,786,812 B2 | 8/2010 | McCorquodale et al. | |
| 7,924,110 B2 | 4/2011 | McCorquodale et al. | |
| 7,978,017 B2 | 7/2011 | Pernia et al. | |
| 8,022,779 B2 | 9/2011 | Ayazi et al. | |

(Continued)

OTHER PUBLICATIONS

Maneatis, John G., "Low-Jitter Process-Independent DLL and PLL Based on Self-Biased Techniques", IEEE Journal of Solid-State Circuits, vol. 31, No. 11, Nov. 1996, pp. 1723-1732 (10 pages).

(Continued)

*Primary Examiner* — Ryan Johnson
(74) *Attorney, Agent, or Firm* — Myers, Bigel & Sibley P.A.

(57) ABSTRACT

A programmable delay generator includes a calibration circuit and a delay line responsive to a calibration control signal generated by the calibration circuit. The calibration circuit includes a digitally-controlled oscillator (DCO) having a first plurality of delay stages therein. A frequency of the DCO is set by the calibration control signal. The delay line includes a second plurality of delay stages that are replicas of the first plurality of delay stages. The calibration circuit may include a current steering digital-to-analog converter (CSDAC), which is responsive to a digital calibration code, and a current-to-voltage converter, which is responsive to at least one current signal generated by the CSDAC. The DCO and other portions of the calibration circuit are disabled into a low power state upon completion of a calibration operation, which may commence upon start-up.

17 Claims, 7 Drawing Sheets

(56) References Cited

U.S. PATENT DOCUMENTS 8,072,259 B1 12/2011 Isik
2006/0132204 A1* 6/2006 Kumata .................. G11C 7/02
327/158

OTHER PUBLICATIONS

Maneatis et al., "Precise Delay Generation Using Coupled Oscillators", IEEE Journal of Solid-State Circuits, vol. 28, No. 12, Dec. 1993, pp. 1273-1282 (10 pages).

* cited by examiner

INTEGRATED CIRCUITS HAVING LOW POWER, LOW INTERFERENCE AND PROGRAMMABLE DELAY GENERATORS THEREIN AND METHODS OF OPERATING SAME

FIELD OF THE INVENTION

The present invention relates to integrated circuit devices and, more particularly, to integrated circuit devices having programmable delay circuitry therein for delaying signals that undergo regular and/or intermittent transitions.

BACKGROUND

Conventional delay generators that utilize analog replica biasing schemes often include a delay-locked loop (DLL) or phase-locked loop (PLL) to generate a control voltage, which is typically buffered and used to drive delay stages within a delay generator. Unfortunately, these conventional approaches typically require closed loop operation with a running reference, such as an on-chip crystal oscillator (XO), a voltage-controlled oscillator (VCO), dividers, a phase-frequency detector, a charge pump and a loop filter. As will be understood by those skilled in the art, such closed loop operation with a continuously running DLL/PLL/XO can burn significant power and generate spurs to low phase noise clocks. Moreover, to reduce spur coupling, regulators were typically required, which further increased power consumption and chip layout requirements. Alternative approaches have included using digital PLLs to digitize the control voltage generation, followed by a digital-to-analog converter (DAC) to regenerate the control voltage for other components within the delay generator. However, this latter approach was prone to systematic mismatch of control voltages between the DLL/PLL and other delay generating components.

One example of a digital delay line is disclosed in commonly assigned U.S. Pat. Nos. 6,856,558 and 6,944,070 to Proebsting et al., entitled "Integrated Circuit Devices Having High Precision Digital Delay Lines Therein," the disclosure of which is hereby incorporated herein by reference. In particular, the '558 and '070 patents disclose a delay line control circuit, which generates an injection control signal by counting multiple cycles of a high frequency ring oscillator signal.

SUMMARY OF THE INVENTION

A programmable delay generator according to embodiments of the invention includes a calibration circuit and a delay line responsive to a calibration control signal generated by the calibration circuit. The calibration circuit includes a digitally-controlled oscillator (DCO) having a first plurality of delay stages therein. A frequency of the DCO, which may be configured as a ring oscillator, is set by the calibration control signal. The delay line includes a second plurality of delay stages, which are preferably configured as replicas of the first plurality of delay stages. The calibration circuit may include a non-monotonic digital-to-analog converter, such as a current steering digital-to-analog converter (CSDAC), which is responsive to a digital calibration code, and a current-to-voltage converter, which is responsive to at least one current signal generated by the CSDAC. The DCO and other portions of the calibration circuit can be disabled into respective low power states upon completion of a calibration operation, which may commence upon start-up of an integrated circuit chip containing the programmable delay generator. This configuration of the DCO, calibration circuit and delay line provides an accurate, low power and low interference delay generator which is less susceptible to delay variations due to process corners and supply voltage changes.

According to some embodiments of the invention, the calibration circuit include a frequency comparator (with digital calibration code generation), which is responsive to a reference clock (REFCLK) and a periodic feedback signal, which is synchronized to a periodic signal generated by the DCO. Preferably, the frequency comparator is configured to generate a varying multi-bit digital calibration code during a calibration operation and retain a final digital calibration code therein upon completion of the calibration operation. The calibration circuit may also include a feedback divider, which is configured to generate the periodic feedback signal in response to the periodic signal generated by the DCO during the calibration operation. Advantageously, the DCO and the feedback divider are disabled into respective low power states upon completion of the calibration operation. This completion of the calibration operation also terminates further frequency comparison operations within the frequency comparator.

A programmable delay generator according to further embodiments of the invention includes a calibration circuit having a digitally-controlled oscillator (DCO) therein. A frequency of this DCO is set by a first control signal generated by the calibration circuit during a calibration operation when the DCO is active. A delay line is provided, which has a plurality of delay stages therein. The delay stages within the delay line are responsive to a second control signal generated by the calibration circuit upon completion of the calibration operation when the DCO is inactive. Preferably, the DCO includes a plurality of delay stages that are replicas of the plurality of delay stages in the delay line. The DCO may be configured as a ring oscillator and the calibration circuit may include a feedback divider (FD), which is responsive a periodic signal generated by the ring oscillator. The calibration circuit may also include a frequency comparator, which is responsive to a reference clock (REFCLK) and a periodic feedback signal generated by the feedback divider. The frequency comparator and feedback divider are disabled into respective low power states upon completion of the calibration operation. The calibration circuit may also include a current-steering digital-to-analog converter (CSDAC), which is responsive a digital calibration code generated by the frequency comparator. This CSDAC remains active during the calibration operation and post completion of the calibration operation. A magnitude of a current generated by the CSDAC controls a frequency of the periodic signal generated by the ring oscillator during the calibration operation and controls a delay provided by the plurality of delay stages within the delay line post completion of the calibration operation.

DETAILED DESCRIPTION OF EMBODIMENTS

Figure 1:
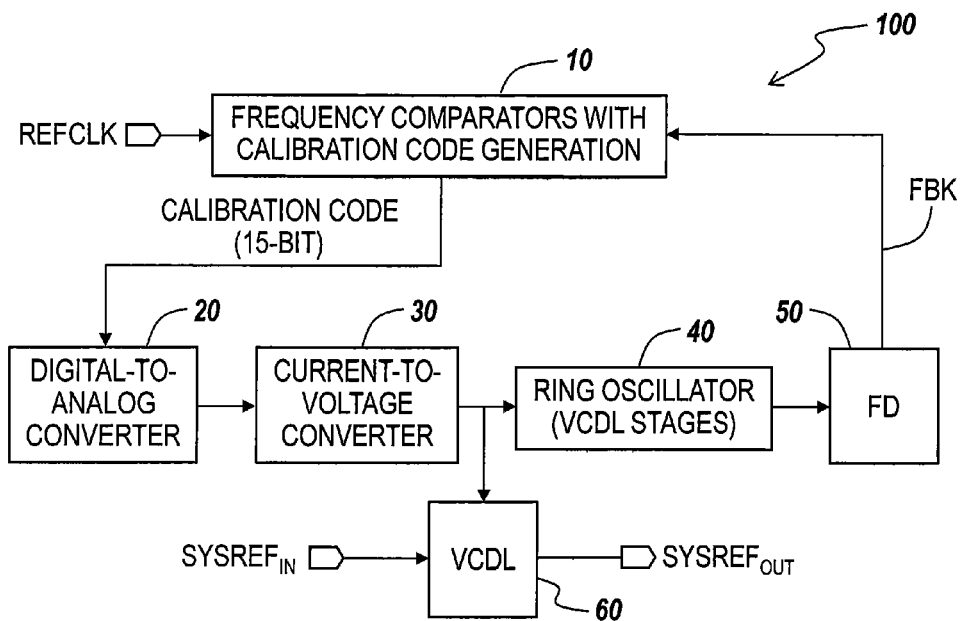
FIG. 1 is a block diagram of a programmable delay generator according to embodiments of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element is referred to as being "on," "connected to" or "coupled to" another element, it can be directly connected or coupled to the other element or an intervening element(s) may be present. In contrast, when an element is referred to as being "directly connected to" or "directly coupled to" another element, there are no intervening elements present.

It will be understood that, although the terms first, second, third, etc. may be used herein to describe various elements, components, regions and/or sections, these elements, components, regions and/or sections should not be limited by these terms. These terms are only used to distinguish one element, component, region or section from another region or section. Thus, a first element, component, region or section discussed below could be termed a second element, component, region or section without departing from the teachings of the present invention.

As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which the present invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
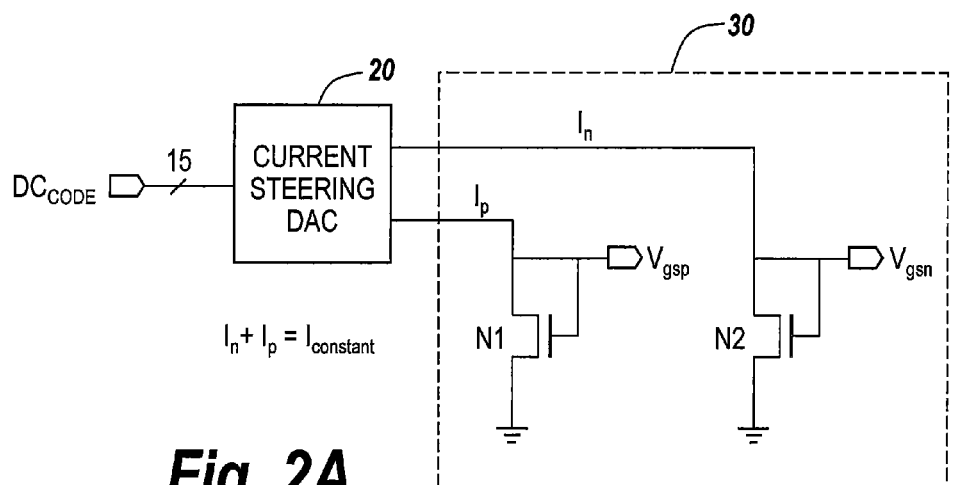
FIGS. 2A-2B are electrical schematics of a digital-to-analog converter (DAC) and current-to-voltage converter that may be utilized in the programmable delay generator of FIG. 1, according to embodiments of the invention.
Figure 2B:
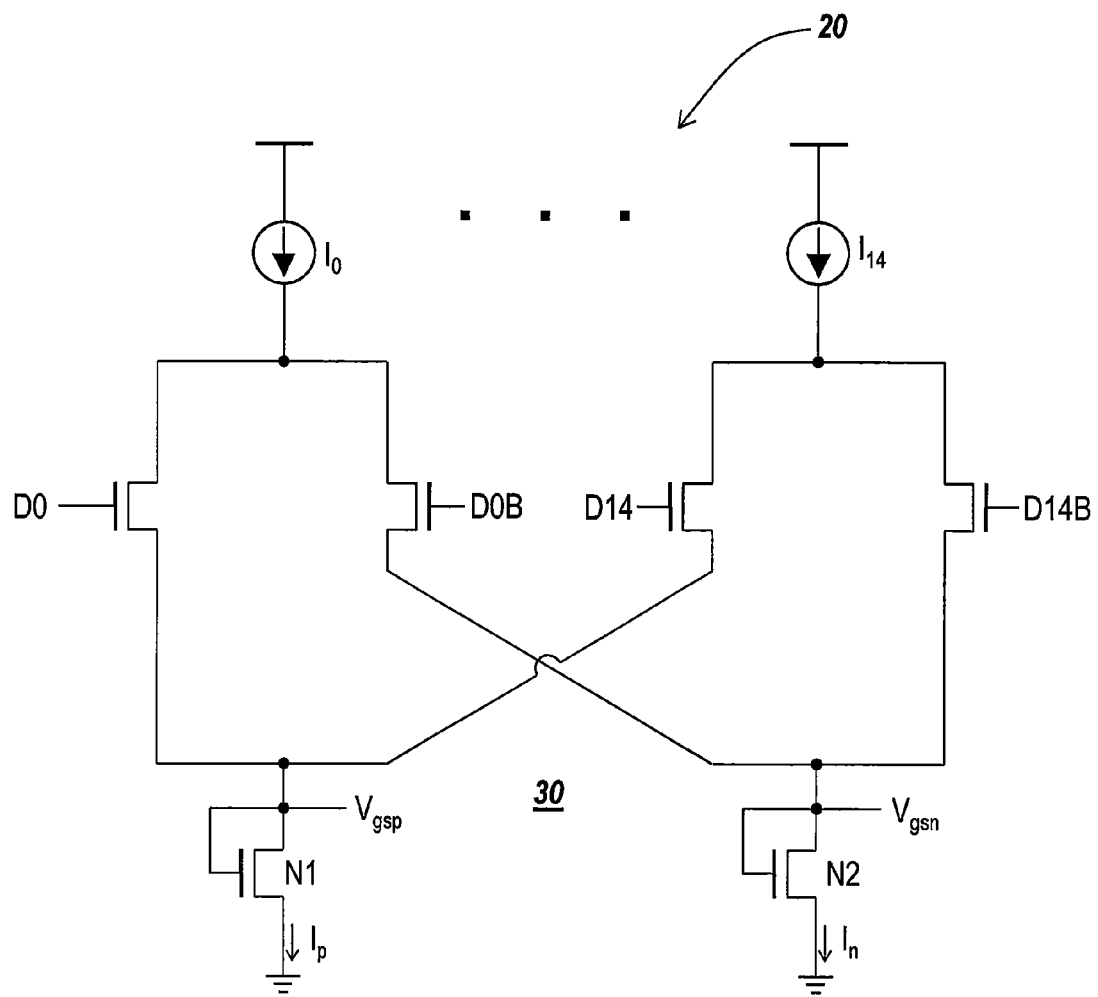
Figure 4A:
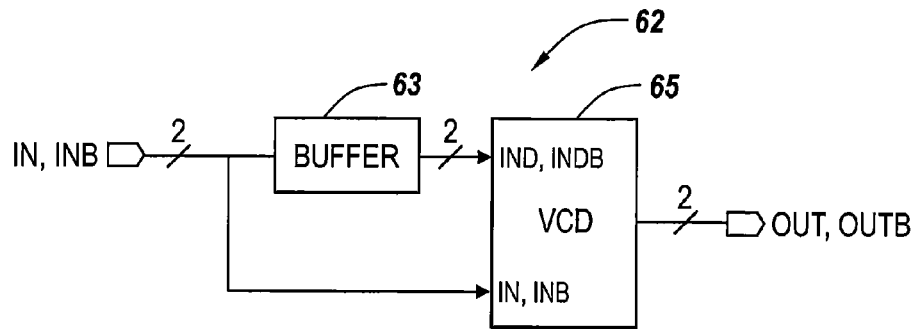
FIG. 4A is a block diagram of a voltage-controlled delay line (VCDL) stage according to embodiments of the invention.
Figure 4B:
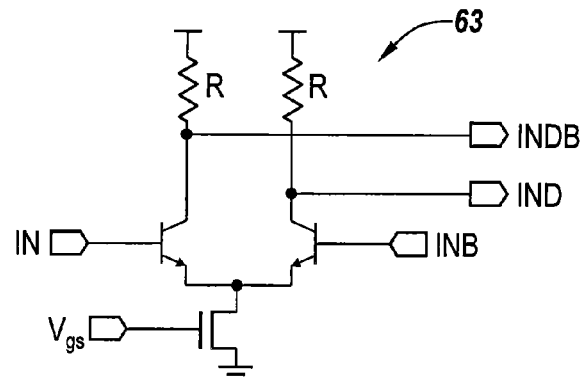
FIG. 4B is an electrical schematic of a voltage-controlled delay buffer that may be utilized in the VCDL stage of FIG. 4A.
Figure 4C:
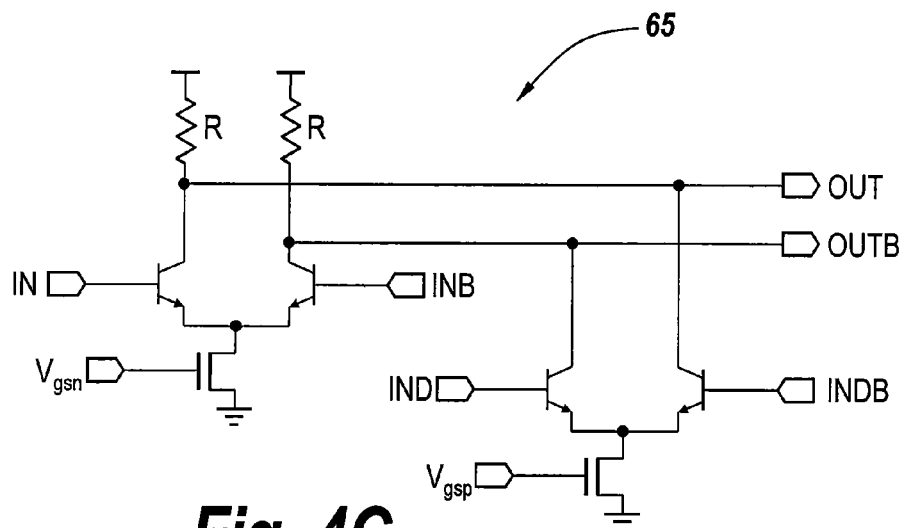
FIG. 4C is an electrical schematic of a 4-input voltage-controlled delay (VCD) stage that may be utilized in the VCDL stage of FIG. 4A.
Figure 4D:
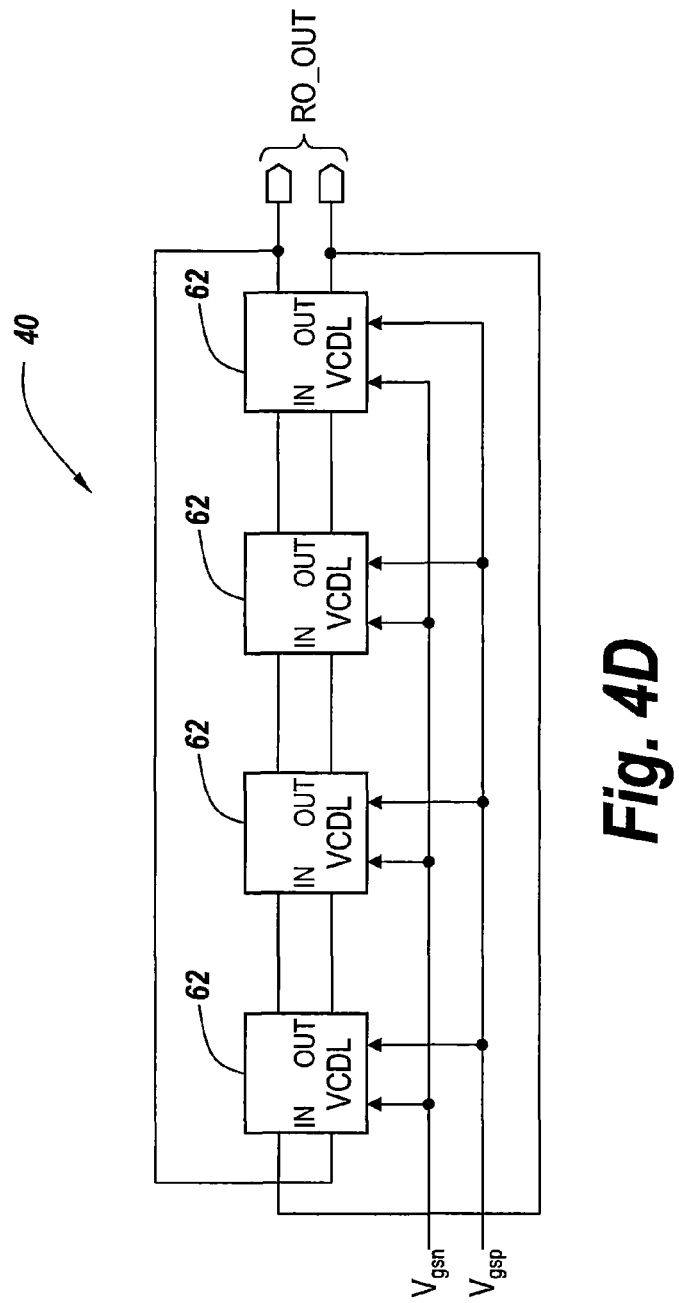
FIG. 4D is an electrical schematic of a ring oscillator that utilizes the VCDL stages of FIGS. 4A-4C therein.

Referring now to FIG. 1, a programmable delay generator 100 according to some embodiments of the invention is illustrated as including a multi-component calibration circuit and a voltage-controlled delay line (VCDL) 60, which is responsive to a calibration control signal generated by the calibration circuit. This calibration circuit includes a digitally-controlled oscillator (DCO) 40 having a first plurality of delay stages 62 therein as shown by FIG. 4D. A frequency of the DCO 40, which may be configured as a ring oscillator, as shown, is controlled by the calibration control signal. This calibration control signal may take the form of a pair of analog voltage signals (e.g., Vgsn, Vgsp) as shown by FIGS. 2A-2B. The voltage-controlled delay line 60 includes a second plurality of delay stages 62, which are preferably configured as replicas of the first plurality of delay stages 62 within the DCO 40. In particular, the first and second plurality of delay stages 62 may be configured as illustrated by FIGS. 4A-4C.

The calibration circuit further includes a digital-to-analog converter (DAC) 20, such as a current steering digital-to-analog converter (CSDAC), which operates as a non-monotonic DAC that is responsive to a digital calibration code. The advantageous use of a non-monotonic DAC ensures that the least-significant bit (LSB) step during calibration is sufficiently small. A current-to-voltage converter 30 is also provided within the calibration circuit. This current-to-voltage converter 30 is responsive to at least one current signal generated by the CSDAC. As described more fully hereinbelow, the DCO 40 and other portions of the calibration circuit can be disabled into respective low power states upon completion of a calibration operation, which may commence automatically upon start-up of an integrated circuit chip containing the programmable delay generator 100.

FIG. 1 further illustrates the inclusion of a frequency comparator 10 within the calibration circuit, which drives the DAC 20 with a digital calibration code (e.g., 15-bit code). This frequency comparator 10 may include a binary search engine therein, which supports the performance of digital calibration operations during a calibration time interval, which may commence upon start-up. These digital calibration operations can include comparing a frequency of a periodic reference signal, shown as REFCLK, against a frequency of a periodic feedback signal FBK generated by a feedback divider (FD) 50 and then incrementally adjusting the digital calibration code until the frequency of the feedback signal FBK matches a frequency of REFCLK. Once this frequency match occurs, a desired delay provided by each of the stages 62 of the ring oscillator DCO 40 and the voltage-controlled delay line 60 can be established. The frequency comparator 10 is further configured to store a final digital calibration code within the calibration circuit upon completion of the calibration operation. Furthermore, to save power and reduce noise generation, the frequency comparing logic within the frequency comparator 10 as well as the DCO 40 and FD 50 are collectively powered down, whereas the DAC 20 and current-to-voltage converter 30 remain active so that the stored digital calibration code operates to establish and maintain a fixed delay associated with each of the delay stages 62 within the VCDL 60, upon completion of the calibration operations. The VCDL 60 may further include a multiplexer (not shown), which is responsive to a control signal that selects a desired output of the VCDL 60. In this manner, a desired total delay between a periodic input signal ($SYSREF_{IN}$) and a periodic output signal ($SYSREF_{OUT}$) can be selected as an integer multiple of the per stage delay within the VCDL 60. As will be further understood by those skilled in the art, the VCDL 60 may operate to delay data or other signals that undergo logic transitions (low-to-high and high-to-low) from time-to-time during a fixed or variable time interval (e.g., periodically in an intermittent manner).

Referring now to FIGS. 1 and 2A-2B, the calibration circuit is shown as including a series combination of a digital-to-analog converter (DAC) 20, which is responsive to a 15-bit digital calibration code, and a current-to-voltage converter 30, which receives analog current signals (e.g., $I_n$ and $I_p$, where $I_n + I_p = I_{constant}$) from the DAC 20. This DAC 20, which is shown as a current steering DAC 20, includes a plurality of binary-weighted current sources, which are shown as $I_0$ through $I_{14}$. As shown by the 15 pairs of NMOS transistors, which are responsive to the 15-bit code ((D0, D0B), (D1, D1B), . . . , (D14, D14B)), the value of each bit of the code (e.g., MSB bit (14) through LSB bit (0)) determines whether the total current from a corresponding binary-weighted current source $I_0$ through $I_{14}$ is directed through NMOS transistor N1 (left side) or NMOS transistor N2 (right side) within the current-to-voltage converter 30. Moreover, because the NMOS transistors N1 and N2 are configured to operate as diodes where Vgs (gate-to-source) equals Vds (drain-to-source), the combined left side current $I_p$ through NMOS transistor N1 will generate an analog output voltage Vgsp and the combined right side current $I_n$ through NMOS transistor N2 will generate an analog output voltage Vgsn. As will be understood by those skilled in the art, the magnitudes of Vgsp and Vgsn are proportional to $I_p$ and $I_n$.

Figure 3A:
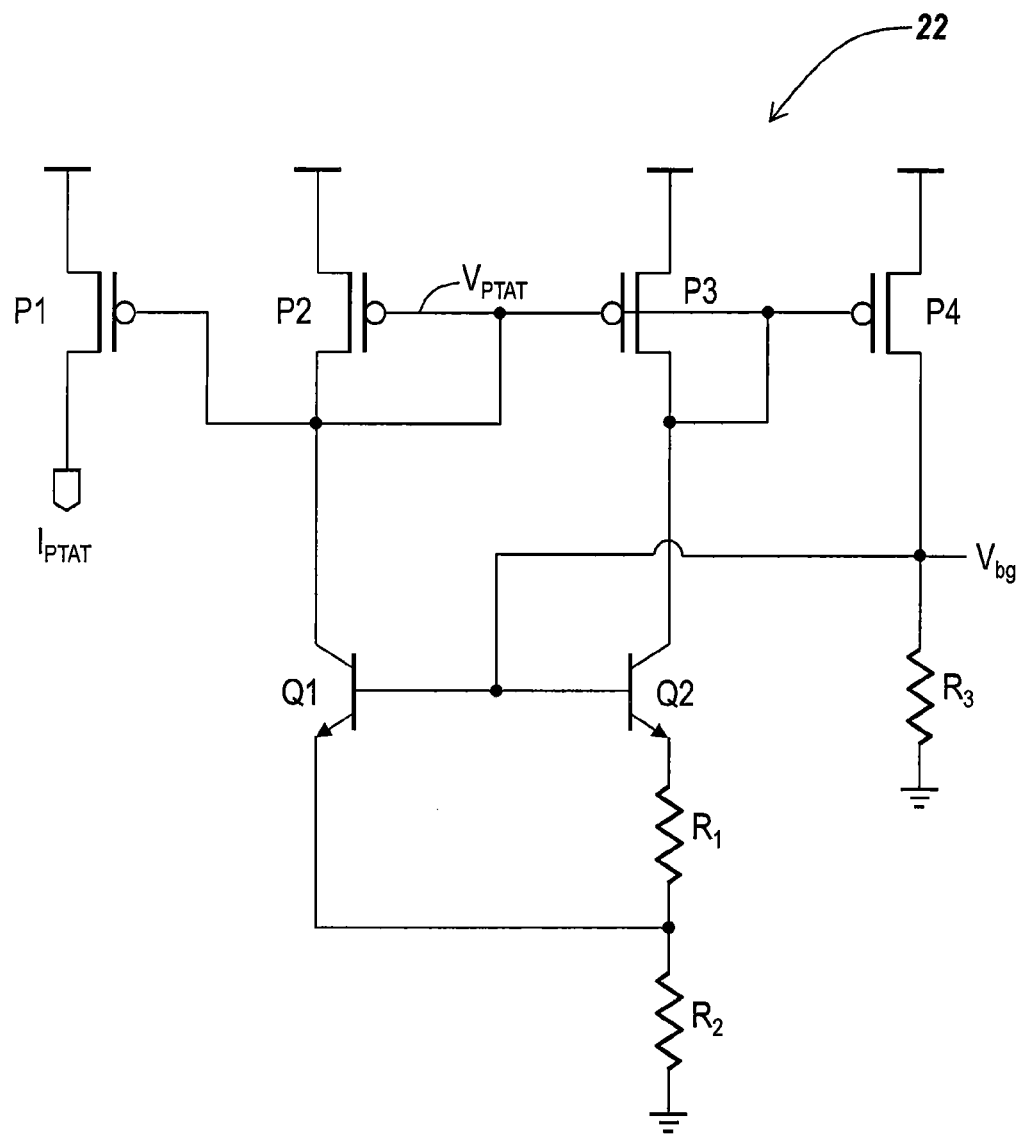
FIGS. 3A-3C are electrical schematics of a binary-weighted current generator that may be utilized with the DAC of FIGS. 2A-2B, according to embodiments of the invention.
Figure 3B:
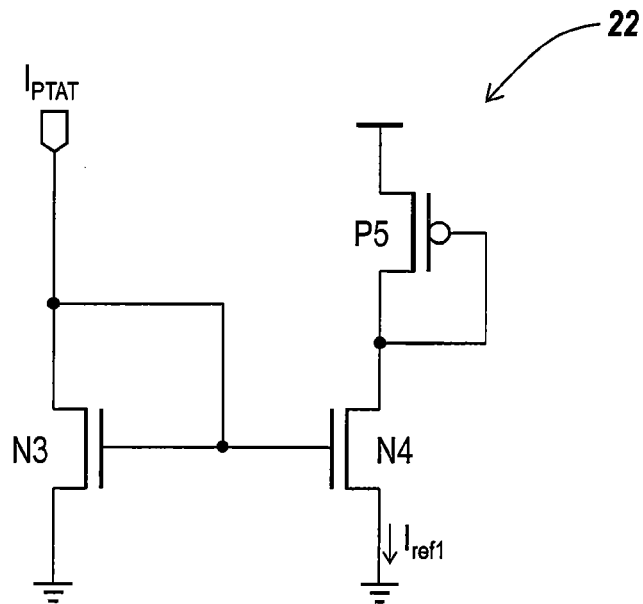
Figure 3C:
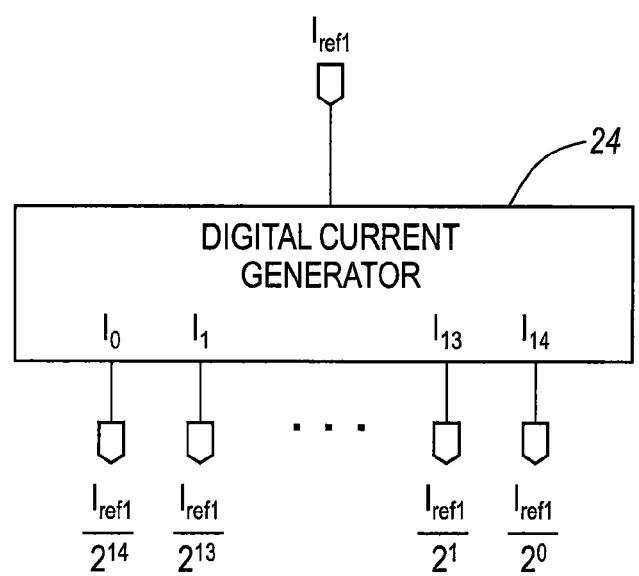

Referring now to FIGS. 3A-3C, conventional proportional-to-absolute temperature (PTAT) technology is utilized to generate a current reference $I_{ref1}$. This current reference $I_{ref1}$ is digitized by a digital current generator 24, which operates as the current sources $I_0$ through $I_{14}$ shown in FIG. 2B. Related examples of PTAT technology are disclosed in commonly assigned U.S. Pat. No. 8,072,259 to Isik, the disclosure of which is hereby incorporated herein by reference. An embodiment of this PTAT technology is illustrated in FIGS. 3A-3B as including PMOS pull-up transistors P1-P4, which have gate terminals supported at a voltage of $V_{PTAT}$. As shown by FIG. 3A, PMOS pull-up transistor P1 generates a drain-to-source current $I_{PTAT}$, which is a function of the node voltage $V_{PTAT}$. In addition, PMOS transistors P2-P4 are biased by NPN transistors Q1-Q2 and resistors $R_1-R_3$, as illustrated. As shown by FIG. 3B, the current $I_{PTAT}$ is provided to a current mirror containing NMOS transistors N3-N4 and diode-connected PMOS transistor P5, which supports generation of $I_{ref1}$. And, as shown by FIG. 3C, it is this current $I_{ref1}$ that sets the binary-weighted values of the source currents illustrated by FIG. 2B.

Referring now to FIG. 4A, a preferred voltage-controlled delay line (VCDL) stage 62 is illustrated as generating a differential output signal OUT, OUTB (i.e., /OUT) as a delayed version of a differential input signal IN, INB (i.e., /IN), with the length of delay being controlled by a plurality of voltage control signals Vgs, Vgsn and Vgsp. The control signal Vgs may be a fixed voltage signal whereas the control signals Vgsn and Vgsp will typically vary during calibration operations until the calibration code is finally set by the frequency comparator and calibration code generator 10. As shown by FIG. 4A, the VCDL stage 62 includes a differential signal buffer 63 and a voltage-controlled delay device (VCD) 65, which is responsive to two pairs of periodic signals (IN, INB) and (IND, INDB), where the term "periodic" is used herein to include signals have a regular period (e.g., clock signals) and other signals, such as data signals, that undergo logic transitions (low-to-high and high-to-low) from time-to-time.

FIG. 4B illustrates an embodiment of the signal buffer 63, which converts a pair of periodic input signals IN, INB, which are provided to the base terminals of a pair of NPN transistors, into a pair of "buffered" output signals IND, INDB. As will be understood by those skilled in the art, the switching speed of the signal buffer 63 is influenced by a magnitude of the gate voltage Vgs, which is provided to a gate terminal of a corresponding NMOS pull-down transistor. FIG. 4C illustrates an embodiment of the voltage-controlled delay device (VCD) 65, which converts the two pairs of signals (IN, INB) and (IND, INDB) into the differential output signal (OUT, OUTB) using two BJT-based differential amplifiers, which share a common load defined by resistors R. As will be understood by those skilled in the art, the speeds at which the differential amplifiers switch in response to the respective pairs of periodic input signals (IN, INB) and (IND, INDB) is a function of the respective magnitudes of gate control signals Vgsn, Vgsp provided to the NMOS pull-down transistors. Accordingly, each VCDL stage 62 has an equivalent delay, which is set by the magnitudes of the gate control signals Vgsn and Vgsp.

Figure 4E:
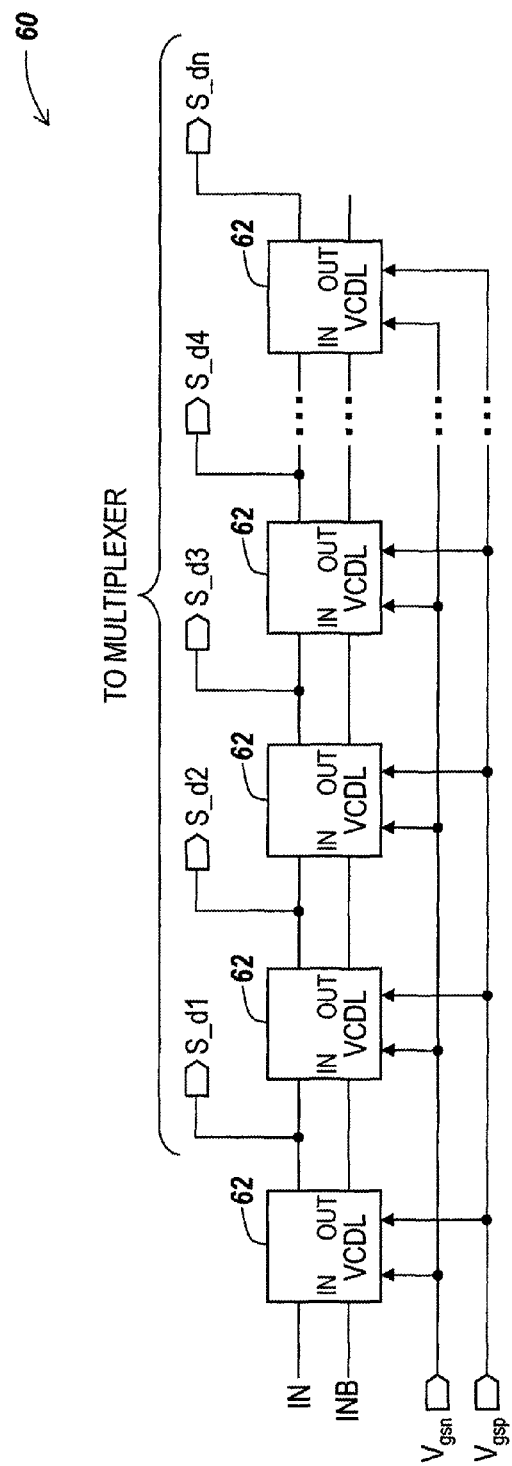
FIG. 4E is an electrical schematic of a multi-stage voltage-controlled delay line that utilizes the VCDL stages of FIGS. 4A-4C therein.

The ring oscillator 40 of FIG. 4D includes four VCDL stages 62, which set the frequency of a ring oscillator output signal RO_OUT (provided to an input of a feedback divider 50 within the calibration circuit) and this frequency is function of the magnitudes of the control signals Vgsn, Vgsp. Similarly, the matched voltage controlled delay line (VCDL) 60 of FIG. 4E operates to provide an additive series of equivalent delays to a periodic input signal (IN, INB), which is shown as SYSREF$_{IN}$ in FIG. 1, to thereby generate a plurality of periodic output signals S_d1 through S_dn having equally spaced phases. A multiplexer (not shown) may be used to select amongst these periodic output signals S_d1 through S_dn to thereby generate a periodic output signal SYSREF$_{OUT}$ with a desired delay/phase relative to SYSREF$_{IN}$.

Thus, as described hereinabove, open-loop DCO tuning can be used in combination with control voltage generation using a high resolution DAC. This control voltage is applied to both the delay line and the DCO to thereby eliminate any system-level offset between the DCO control voltage and the delay line control voltage. Moreover, the use of an open-loop approach eliminates any need for a phase-frequency detector (PFD), charge pump (CP) and low-pass filter (LPF). After a high resolution digital code representing the desired delay is achieved during calibration, the DCO and phase comparator circuitry is powered down while the DAC (e.g., CSDAC) remains operative to support the correct control voltage.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A programmable delay generator, comprising:
   a calibration circuit comprising a digitally-controlled oscillator (DCO) having a first plurality of delay stages therein, said DCO having a frequency set by a first control signal generated by said calibration circuit during a calibration operation; and
   a delay line having a second plurality of delay stages therein that are replicas of the first plurality of delay stages within said DCO and responsive to a second control signal generated by said calibration circuit upon conclusion of the calibration operation when said DCO is powered-down into an inactive state.

2. The programmable delay generator of claim 1, wherein said calibration circuit comprises a current steering digital-to-analog converter (CSDAC) responsive to a digital calibration code and a current-to-voltage converter responsive to at least one current signal generated by said CSDAC; and wherein the current-to-voltage converter is active during the calibration operation and upon conclusion of the calibration operation when said DCO is powered-down into the inactive state.

3. The programmable delay generator of claim 2, wherein the current-to-voltage converter is responsive to a pair of current signals generated by said CSDAC, which remains active when said DCO is powered-down into the inactive state; wherein a magnitude of the pair of analog current signals remains constant during calibration of said DCO; and wherein the first and second control signals are equivalent.

4. The programmable delay generator of claim 1, wherein said DCO is configured as a ring oscillator.

5. The programmable delay generator of claim 1, wherein said DCO is configured as a ring oscillator having N delay stages therein; and wherein said delay line has M stages therein, where N and M are positive integers and M is greater than N.

6. The programmable delay generator of claim 1, wherein said calibration circuit comprises a frequency comparator responsive to a reference clock and a periodic feedback signal, which is synchronized to a periodic signal generated by said DCO during the calibration operation; and wherein the periodic signal is disabled upon conclusion of the calibration operation.

7. The programmable delay generator of claim 1, wherein said calibration circuit comprises a non-monotonic digital-to-analog converter (DAC).

8. A programmable delay generator, comprising:
a calibration circuit comprising a digitally-controlled oscillator (DCO) having a first plurality of delay stages therein, said DCO having a frequency set by a first control signal generated by said calibration circuit; and
a delay line having a second plurality of delay stages therein that are replicas of the first plurality of delay stages within said DCO and responsive to a second control signal generated by said calibration circuit;
wherein said calibration circuit comprises a frequency comparator responsive to a reference clock and a periodic feedback signal, which is synchronized to a periodic signal generated by said DCO; and
wherein the frequency comparator is configured to generate a varying multi-bit digital calibration code during a calibration operation and store a final digital calibration code upon completion of the calibration operation.

9. A programmable delay generator, comprising:
a calibration circuit comprising a digitally-controlled oscillator (DCO) having a first plurality of delay stages therein, said DCO having a frequency set by a first control signal generated by said calibration circuit; and
a delay line having a second plurality of delay stages therein that are replicas of the first plurality of delay stages within said DCO and responsive to a second control signal generated by said calibration circuit;
wherein said calibration circuit comprises a frequency comparator responsive to a reference clock and a periodic feedback signal, which is synchronized to a periodic signal generated by said DCO; and
wherein said calibration circuit comprises a feedback divider configured to generate the periodic feedback signal in response to the periodic signal generated by said DCO during a calibration operation; and wherein said DCO and the feedback divider are disabled into a low power state upon completion of the calibration operation.

10. A programmable delay generator, comprising:
a calibration circuit comprising a digitally-controlled oscillator (DCO) having a first plurality of delay stages therein, said DCO having a frequency set by a first control signal generated by said calibration circuit; and
a delay line having a second plurality of delay stages therein that are replicas of the first plurality of delay stages within said DCO and responsive to a second control signal generated by said calibration circuit;
wherein said calibration circuit comprises a current steering digital-to-analog converter (CSDAC) responsive a digital calibration code and a current-to-voltage converter responsive to at least one current signal generated by said CSDAC; and
wherein said calibration circuit further comprises a frequency comparator responsive to a reference clock and a periodic feedback signal, which is synchronized to a periodic signal generated by said DCO, said frequency comparator configured to generate the digital calibration code as a varying code during a calibration operation and store a final digital calibration code upon completion of the calibration operation.

11. The programmable delay generator of claim 10, wherein frequency comparison operations within said frequency comparator are terminated and said DCO is disabled into a low power state upon completion of the calibration operation.

12. A programmable delay generator, comprising:
a calibration circuit comprising a digitally-controlled oscillator (DCO) having a frequency set by a first control signal generated by said calibration circuit during a calibration operation when said DCO is active; and
a delay line having a plurality of delay stages therein that are responsive to a second control signal generated by said calibration circuit upon completion of the calibration operation when said DCO is inactive.

13. The programmable delay generator of claim 12, wherein said DCO comprises a plurality of delay stages therein that are replicas of the plurality of delay stages in said delay line.

14. The programmable delay generator of claim 13, wherein said DCO is configured as a ring oscillator; and wherein said calibration circuit comprises a feedback divider responsive a periodic signal generated by the ring oscillator.

15. The programmable delay generator of claim 14, wherein said calibration circuit comprises a frequency comparator responsive to a reference clock and a periodic feedback signal generated by the feedback divider; and wherein the frequency comparator and feedback divider are disabled into respective low power states upon completion of the calibration operation.

16. The programmable delay generator of claim 15, wherein said calibration circuit comprises a current steering digital-to-analog converter (CSDAC) responsive a digital calibration code generated by the frequency comparator; and wherein the CSDAC remains active during the calibration operation and post completion of the calibration operation.

17. The programmable delay generator of claim 16, wherein a magnitude of a current generated by the CSDAC controls a frequency of the periodic signal generated by the ring oscillator during the calibration operation and controls a delay provided by the plurality of delay stages within the delay line post completion of the calibration operation.

\* \* \* \* \*